United States Patent
Chang et al.

(10) Patent No.: US 6,607,934 B2
(45) Date of Patent: Aug. 19, 2003

(54) MICRO-ELECTROMECHANICAL PROCESS FOR FABRICATION OF INTEGRATED MULTI-FREQUENCY COMMUNICATION PASSIVE COMPONENTS

(75) Inventors: Pei-Zen Chang, Taipei (TW); Jung-Tang Huang, Taipei (TW); Hung-Hsuan Lin, Taipei (TW)

(73) Assignee: Lenghways Technology Co., Ltd., Taipei (TW)

( * ) Notice: Subject to any disclaimer, the term of this patent is extended or adjusted under 35 U.S.C. 154(b) by 0 days.

(21) Appl. No.: 09/985,970

(22) Filed: Nov. 7, 2001

(65) Prior Publication Data

US 2002/0098611 A1 Jul. 25, 2002

(30) Foreign Application Priority Data

Nov. 18, 2000 (TW) ........................... 89124491 A

(51) Int. Cl.$^7$ ................................ H01L 21/00
(52) U.S. Cl. .................... 438/50; 438/51; 438/52; 438/53; 438/54; 438/119; 438/456
(58) Field of Search .................. 438/50, 51, 52, 438/53, 54, 119, 456, 64, 67, 88, 89, 106, 112, 124, 126, 455, 466, 470

(56) References Cited

U.S. PATENT DOCUMENTS

| | | | | | |
|---|---|---|---|---|---|
| 5,952,712 | A | * | 9/1999 | Ikuina et al. | 257/678 |
| 6,140,144 | A | * | 10/2000 | Najafi et al. | 438/53 |
| 6,232,150 | B1 | * | 5/2001 | Lin et al. | 438/119 |
| 6,436,853 | B2 | * | 8/2002 | Lin et al. | 438/800 |

* cited by examiner

Primary Examiner—Matthew Smith
Assistant Examiner—V. Yevsikov
(74) Attorney, Agent, or Firm—Rosenberg, Klein & Lee

(57) ABSTRACT

A micro-electromechanical (MEM) process for fabrication of integrated multi-frequency communication passive components is fused into co-fired ceramics by way of "flip chip" for fabrication of a low-cost, high-performance, and high-reliability hybrid communication passive component applicable in the frequency range of 0.9 GHz~100 GHz. The basic structure of the passive component is a double-layer substrate comprising a low-loss ceramic or glass bottom-layer substrate and a glass or plastic poly-molecular top-layer substrate and an optional ceramic substrate at the lowest layer. As the materials used and the processing temperature in the MEM process is compatible with the CMOS process, thus this invention is fit for serving as a post process following the CMOS process.

14 Claims, 14 Drawing Sheets

18

19

20

21

22

MICRO-ELECTROMECHANICAL PROCESS FOR FABRICATION OF INTEGRATED MULTI-FREQUENCY COMMUNICATION PASSIVE COMPONENTS

FIELD OF THE INVENTION

This invention relates generally to integrated multi-frequency communication passive components made by micro-electromechanical (MEM) techniques, more particularly, it relates to a MEM process for fabrication of integrated multi-frequency communication passive components by fusing a "flip-chip" approach into low-temperature co-fired ceramics so as to produce a low-cost, high-performance, and high-reliability hybrid communication component.

BACKGROUND OF THE INVENTION

Thanks to the speedy progress of micro-electromechanical (MEM) techniques, size of wireless communication systems have been significantly minimized in recent days, and "communication system on a single chip" is considered a trend ready on the road. For example, the "Watch phone" of Samsung Korea presented to the U.S. market for transmitting wireless voice or e-mail is a phone set in volume slightly larger than a conventional watch, and Hewlett Packard, a widely known company of communication equipments and medical instruments, works together with Swatch, a Swiss watch maker, for research and development of a new watch capable of monitoring wireless network and medical care. The examples already tell a new track for the communication single chip to sprint forward.

However, a single chip is so far incapable of handling a wireless communication system by itself alone when lacking some cooperative components, such as the surface acoustic wave (SAW) filter, quartz oscillator, microswitch, etc., and some on-chip inductors and variable capacitors disposed by using MEM techniques to minimize volume of the communication system and reduce assembly cost thereof.

In reviewing the chip-fabrication process, the CMOS fabrication process is considered workable to satisfy systems below 5~6 GHz (oscillation components already up to 9 GHz) while that of Bipolar or GaAs device is applicable to systems in higher frequencies, and meanwhile, MEM techniques are progressed upwardly to try breaking through the critical watershed. So far, Clark T. C. Nguyen and Linda P. B. Katehi in Electrical Engineering Department of the Michigan University may be recommended as the global typical representative figures for research of MEM communication components, wherein the former aims at the components below 2.5 GHz while the latter at 20 GHz up; and both use silicon substrate.

In a long-range consideration, the fabrication process of MEM wireless communication components below 10 GHz will probably go compatibly with the CMOS process, otherwise, the process may become more complicated and the original electrical parameters as well as the yield rate may be deteriorated to some extent that would suggest to adopt discrete components instead. While in a short-range viewpoint, the components above 20 GHz are still a domain of GaAs and compounds of groups III and V in the periodic table of elements.

This invention is positioned and oriented in developing MEM microwave component that takes low-loss substrates, such as $Al_2O_3$ ceramic substrates, glass substrates, etc. in order to lessen signal attenuation, but, as a matter of fact, the developed techniques of this invention are offered with generalities for being applied in multi-frequency bands.

A monolithic microwave integrated circuit (MMIC) is usually merited in: LTSS (light, thin, short, small) measurements, low-cost mass production, wide bandwidth, high reliability, and multi-purpose combination, however, unfortunately, it is defective in: after-adjustment impossible and a relatively longer development time.

In a U.S. Pat. No. 6,049,702, the mentioned techniques regarding an integrated passive transceiver section and MEM fabrication process thereof are found imperfect as described below:

1. MEM techniques are not integrated for application to low-temperature co-fired ceramics, therefore, some low-accuracy passive components for cost saving are not easy to obtain.
2. Only MEM surface micromachining techniques are taught in embodiments for fabrication of capacitors, inductors, and microswitches, application to multi-layer structure, such as antennas or low-frequency filters, and the packaging compatibility is doubtful.
3. Possible coupling interference when integrating and miniaturizing is obviously not yet put into consideration that would inevitably affect the integration density in lack of isolation design.
4. Both materials used and temperature conditions in the fabrication process are different from that of the CMOS process, therefore, such a process may not be a post process to that of the CMOS.
5. Different design methods for different frequency-bands haven't been proposed that wouldn't be capable of controlling circuitry area properly.

In view of above said imperfections, after years of constant efforts in research, the inventors have consequently developed a micro-electromechanical (MEM) process for fabrication of low-cost, high-performance, and high-reliability hybrid communication components.

SUMMARY OF THE INVENTION

The primary object of this invention is to provide a micro-electromechanical (MEM) process for fabrication of integrated multi-frequency communication passive components by fusing MEM techniques into low-temperature co-fired ceramics so as to produce low-cost, high-performance, and high-reliability hybrid communication components, to which high accuracy is a surplus.

Another object of this invention is to provide a micro-electromechanical (MEM) process for fabrication of integrated multi-frequency communication passive components, wherein MEM surface micromachining techniques are applied for disposing capacitors, inductors, microswitches, etc., on a substrate; meanwhile, MEM three-dimensional techniques and the hot-embossing or injection molding method are employed for forming an antenna, a shielding top cover, etc., on another substrate to realize a multi-layer structure.

Yet another object of this invention is to provide a micro-electromechanical (MEM) process for fabrication of integrated multi-frequency communication passive components, wherein coupling interference to be possibly incurred by integrating and miniaturizing is also put into consideration so that the isolation design and corresponding process are prepared.

Yet another object of this invention is to provide a micro-electromechanical (MEM) process for fabrication of integrated multi-frequency communication passive components, wherein materials applied and temperature conditions in the process are compatible with that of the CMOS fabrication process, hence, this MEM process may serve for a post process of the latter.

Yet another object of this invention is to provide a micro-electromechanical (MEM) process for fabrication of integrated multi-frequency communication passive components, which would propose optimum design methods in response to different frequency-band requirements, particularly for the antennas, filters, inductors, etc., to keep the circuitry area indifferent to change of wavelength.

In order to realize abovesaid objects, the MEM process of this invention has integrated passive components in an IC device, whose main architecture is built on a low-loss substrate such as an alumina substrate or a glass substrate, for example, while a low-cost plexiglass plate or a plastic plate made of Poly Methyl Methacrylate (PMMA), for example, may serve as an upper-layer substrate for disposition of an antenna and protection or passivation of a component.

Taking the glass-made substrate for instance, the processing procedure is to firstly perforate a substrate to form via holes, then prepare a simple etching mask for exposing and developing. An etching process on the glass substrate could be made by using Hydrofluoric (HF) acid or by reacting ion etching (RIE), in which etching material is optional for avoiding destruction of a front panel or creation of a undercut in form of an air cavity on the substrate. When such an air cavity is deeper than 30 $\mu$m, it can be processed mechanically by using a tungsten-oxide cutting tool or sand blaster. The grounding layout and a feeding structure on back of an antenna are to be masked together with filters, switches, resistors, capacitors, etc., on the lower low-loss substrate before undergoing etching. Then a metallic layer (Cu) is electroplated on the selfsame low-loss substrate to accomplish a single plane-layer framework containing the antenna feeding lines, filters' input lines, and filters' output lines.

In the case of a PMMA substrate, an upper-layer substrate may be formed by hot-embossing molds.

The purpose of forming an air cavity on the substrate by etching and hot-embossing is to reduce the dielectric constant of the substrate and obtain a wider bandwidth, and this formality may be omitted should the dielectric constant of the substrate itself is relatively low.

Moreover, in order to match with different frequencies and measurements of the component, a double-layer structure will do with respect to low-frequency applications while a double- or single-layer structure is fit for mid- or high-frequency applications because of the relatively smaller area of the component, wherein the silver epoxy may be applied in-between layers; the isolation design of the component will confine "coupling effect" under some specified states; and by taking advantage of a "flip-chip" approach and low-temperature co-fired ceramics, the component of this invention can be integrated to become a low-cost, high-performance, and high-reliability hybrid communication component.

Methods for fabricating related electronic parts are described below individually.

1. About "via hole"

"Via hole" is a very important issue in microwave-circuitry, particularly when most ICs are using a microstrip-line structure. The primary object of the "via hole" is to tightly join a front-surface ground and a back-surface ground together, otherwise, the equivalent inductance caused by the interval between those two grounds will descend the circuit gain and meanwhile consume more power.

The "via hole" is made by perforating a through hole on the backside of the substrate and penetrating through the ground metal on the other (front) side, then the backside is plated to have a copper (Cu) layer attached. To a silicon substrate, an exposure machine for aligning the photo mask on both sides and a charge-coupled device (CCD) camera are required to display the image of backside on monitor that enables an operator to align and adjust position of the masks for exposing. The boring ways according to different substrate materials are listed in the table shown below:

| Substrate material | Silicon substrate | Glass | Ceramic substrate | Plastics |
|---|---|---|---|---|
| Boring way | KOH anisotropic etching; HNA isotropic etching | Mechanical perforation | Mechanical Perforation; Laser drill | Hot-embossing; Injection molding |

A generic chemical plating or electroplating process may be adopted for coating or filling metal in the via hole.

2. About Resistor

In the microwave circuitry, a resistor is usually employed in a bias circuit, a voltage-dividing circuit, or a feedback circuit, in which the temperature coefficient of resistor is the major factor that can affect the circuit's stability under a large-current operation. A metallic thin film resistor has a relatively lower temperature coefficient while those made of the active layer of semiconductor have temperature coefficients at values far exceedingly over that of the metals. The related parameters of thin film resistor in different materials are referenced in the table shown below:

| Material | Single face resistance ($\Omega$) | Temperature coefficient of resistor ppm/° C. | Fabrication method |
|---|---|---|---|
| TaN | 90 | −100 | sputtering |
| GaAs | 300 | 3200 | epitaxial growth or ion-distribution |
| NiCr | 200 | 200 | sputtering |

3. About Solenoid Inductor

An associated air-bridge is usually needed in fabricating a plane inductance for jumping connection, meanwhile, the metallic wire used must be fat enough to reduce ohmic loss in transmission. Hence, in addition to producing a seeding layer by vapor deposition (or electronic beam deposition or sputtering), the metallic wire is further plated to form a thick copper layer and is formed in square for easy fabrication of the photo mask. As the Q value is fluctuated according shape of an inductor and for obtaining a high Q of this invention under various frequencies, the inductor structure of this invention is basically a solenoid inductor. When the inductor is applied under a low frequency, a magnetic body may be inserted in the solenoid coil, which may be substituted by a body with low dielectric constant in the case under a high frequency.

4. About Capacitor

A metal-insulator-metal (MIM) capacitor has some parameters in an insulation layer shown in the table below:

| Material | Dielectric coefficient | Capacitance density pF/mm$^2$ | Q value | Fabrication method |
|---|---|---|---|---|
| Si$_3$N$_4$ | 6.5 | 480 | good | PECVD |
| SiO$_2$ | 4.0 | 340 | excellent | LPCVD |
| Polyimide | 3~4.5 | 30 | excellent | rotational coating and heating |

5. About Antenna

As indicated in FIG. 3, an antenna major structure constructed with MEM techniques is built on a low-loss substrate, wherein a low-cost plexiglass or a polymer substrate, in PMMA for example, may be chosen to form an upper layer, in which:

(I) In case the glass substrate is taken, the forming procedure of the antenna structure is to firstly perforate "via holes" in a wafer; then prepare a simple etching mask for exposing and developing; perform etching process by using Hydrofluoric (HF) acid or by reacting ion etching (RIE) while leave the antenna backside grounding and the pattern of the antenna feeding structure to be masked together with filters, switches, resistors, capacitors, etc., on the lower ceramic substrate before undergoing etching; and electroplate a metallic layer (Cu) on the selfsame low-loss substrate to accomplish a single plane-layer framework containing meanwhile the antenna feeding lines, filters' input lines, and filters' output lines;

(II) In case the PMMA substrate is taken, the upper-layer substrate may be formed by hot embossing or injection molding; the purpose of forming an air cavity on the substrate by etching and hot embossing is to reduce the dielectric constant of the substrate and obtain a wider bandwidth while this forming step may be omitted should the dielectric constant of the substrate itself is relatively low; and a "via hole" is provided to the short-circuit end with an extra resistor if desired to thereby obtain an optimum bandwidth and a patch antenna.

6. About Filter

In the microwave frequency range, it's nothing peculiar to have the circuitry layout of filter amended or changed in response to the size, function, process difficulties, and cost of the filter. When a filter of this invention is employed for low-frequency application (0.9 GHz~5 GHz), the odd/even mode impedance concept for circuitry analysis, a hybrid circuit comprising "distributed" and "lumped" circuits, and the microstrip-line structure for transmission are all adopted as the coplanar waveguide (CPW) structure applicable to a high-frequency range (usually 30 GHz or up) doesn't fit the mentioned range.

7. About Microswitch

The microswitch adopted in this invention is basically a cantilever structure, comprising: an upper electrode set above the cantilever; a contact-electrode set at the end of the cantilever; a lower electrode disposed on the substrate in the vertically projected shadow of the cantilever at a position corresponding to the upper electrode; and a signal-discontinuity line. When a static-electricity force is applied to the upper or the lower electrode alternatively, the cantilever is attracted to contact the lower electrode, for example, to close the circuit, or, on the other hand, the cantilever is restored to let the contact-electrode open the circuit as soon as the static-electricity force is removed.

Integrated With Co-fired Ceramics

The dielectric constant of a LTCC package material is normally equal to 4~8, which would allow a wider microwave transmission line to work that results in a lower conduction loss compared with a transmission circuit on a Si, GaAs, or Alumina substrate. Furthermore, the LTCC has a small amount of loss tangent about 0.002 at 10 GHz and has a relatively lower dielectric attenuation accordingly. The LTCC package is commonly composed of multiple ceramic layers of 0.1~0.15 mm thick each, and between layers, transmission lines and a part of passive components may be printed. The components on each layer may be interconnected by opening via holes with a laser beam or by mechanical perforation before being sintered so as to minimize the package and complete the RF transmission lines, bias lines, and control lines.

Whereas, as high or low accuracy is indifferent to some passive components implemented in a communication system, therefore, it seems reasonable and worthy of integrating the MEM approach to low-temperature co-fired ceramics by setting via holes in a low-loss substrate and forming some bumps on back of the substrate to have the bumps connected with the circuit and the soldering pad in an upmost layer on the substrate to form a "flip-chip" package for cost-saving.

Isolation Design for Components

In fabrication of integrating circuits, a high-density integration of transmission lines or circuit disposition is known liable to incur coupling or cross talk. For improving isolation of package to get rid of coupling or cross talk, following policies may be taken independently or combinedly:

1. Try reducing radiation source and discontinuity in connection between transmission lines and components.
2. Try using metallic shield for besetting wave radiation.
3. Try using material of high dielectric constant for channeling wave radiation.

Regarding the policy of using metallic shield for besetting wave radiation, please refer to the literature—G. E. Ponchak, et. al. "The use of metal filled via holes for improving isolation in LTCC RF and wireless multichip packages," IEEE Tran. Advanced Packaging, Vol. 23, No. 1, February 2000, pp. 88–99-in which LTCC is mentioned for being made in dual-line via holes connected with strip lines to form fences to confine electromagnetic radiation. This policy would entail a great expenditure with limited efficacy.

Besides, in another literature—R. F. Drayton, et. al., "Monolithic Packaging concepts for high isolation in circuits and antennas," IEEE Tran. Microwave Theory and Techniques, Vol. 46, No. 7, July 1998, pp. 900–906—in which an upper cover is mentioned for being etched to form cavities corresponding to microstrip lines, and the inner wall of every cavity is plated with metal and grounded, or a part of the substrate right under the microstrip lines is etched to thereby enclose electromagnetic radiation of the microstrip lines. This is another besetting technology too.

A "channeling" policy suggests to confine most part of electromagnetic radiation in a high dielectric constant material with a negligible amount disappeared in the air.

In short, this invention is designed to waive connection discontinuity between the transmission lines and components, and perform the policy of "besetting" and "channeling" combinedly to eliminate or reduce effect of coupling and/or cross talk.

For more detailed information regarding advantages or features of this invention, at least an example of preferred embodiment will be elucidated below with reference to the annexed drawings.

BRIEF DESCRIPTION OF THE DRAWINGS

The related drawings in connection with the detailed description of this invention to be made later are described briefly as follows, in which.

DETAILED DESCRIPTION OF THE PREFERRED EMBODIMENT

For fabricating multi-frequency passive components by micro-electromechanical (MEM) approach, this invention has classified frequency into "high", "middle", and "low" classes for matching properly with different MEM processes, and moreover, a design method for minimizing circuitry area of antenna or filter which is liable to be affected by frequency range is provided.

Figure 1:
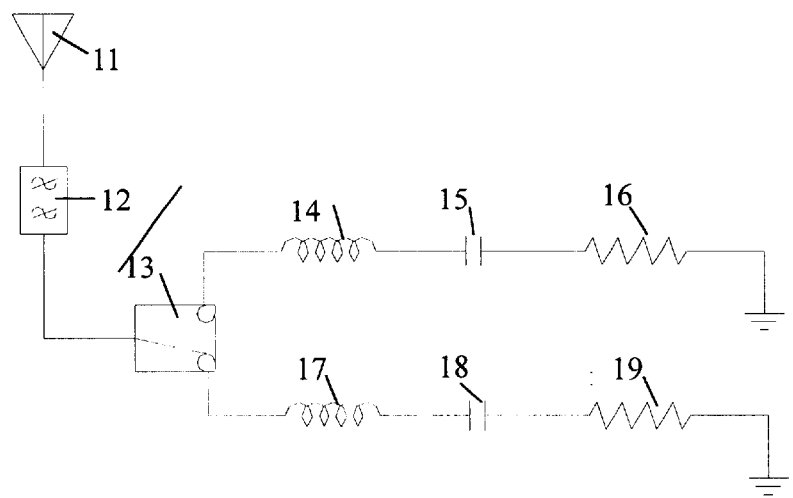
FIG. 1 shows an embodiment circuit of microwave passive components of this invention.
Figure 2:
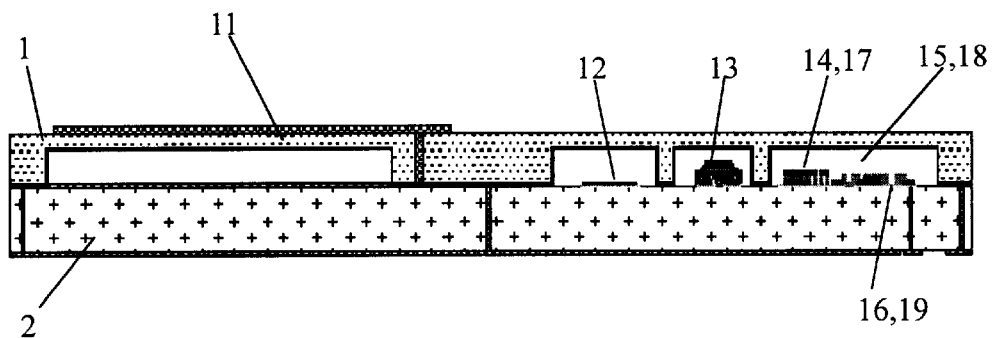
FIG. 2 is a lateral view showing layout of all the microwave passive components.

In an embodiment circuit of microwave passive components of this invention shown in FIG. 1, the circuit comprises an antenna 11, a band-pass filter 12, a transmit/receive (T/R) microswitch 13, a receive inductor 14, a receive capacitor 15, a receive resistor 16, a transmit inductor 17, a transmit capacitor 18, and a transmit resistor 19. FIG. 2 is a lateral view showing layout of all the microwave passive components.

Several embodiments of this invention are described below.

Embodiment 1

Frequency range applicable~30 GHz or up

Free space wavelength $\lambda_0$(air)=10 mm

After calculation, a "distributed" structure or a hybrid structure of coplanar waveguide (CPW) and microstrip lines formed in a double-layer framework is preferable for circuitry layout.

Example~30 GHz

Thickness of a high-frequency antenna is as thin as 0.01~0.05 times the free space wavelength.

A patch antenna is merited in: low profile with conformability, low production cost, and replaceable for a conventional high-gain antenna, but is imperfect in: narrow bandwidth (difference about 5%), relatively higher feeding loss, and low power-handling ability.

In general, the patch antenna is fed in multiple ways and formed in a double- or triple-layer structure on a substrate through optimized design, improved coupling, beam scanning effect, pattern shaping, and matched impedance, wherein the substrate may be made in alumina, plastics, or glass. The patch antenna is fabricated by: electroplating copper (Cu) on a glass or plastic substrate; etching the plated sheet to form air cavities on back to lower down its effective dielectric constant for obtaining a better bandwidth; grounding the sheet with via holes; and finally, connecting the bottom end of the sheet to the alumina substrate with silver paste.

Highlights

Type of antenna~one second wavelength patch antenna

Substrate~PMMA in thickness of 500 μm

Feeding manner~coaxial $L=0.49 \lambda_d=0.49 \lambda_0/(\epsilon \gamma)^{1/2}$ where $\epsilon \gamma$ is an equivalent dielectric constant of the substrate (containing 20% glass or PMMA material and 80% air for example)

Figure 4:
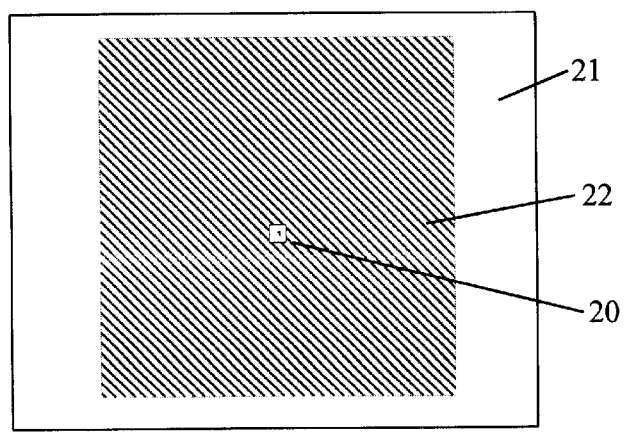
FIG. 4 is a front view of one-half-wavelength antenna of this invention.
Figure 5:
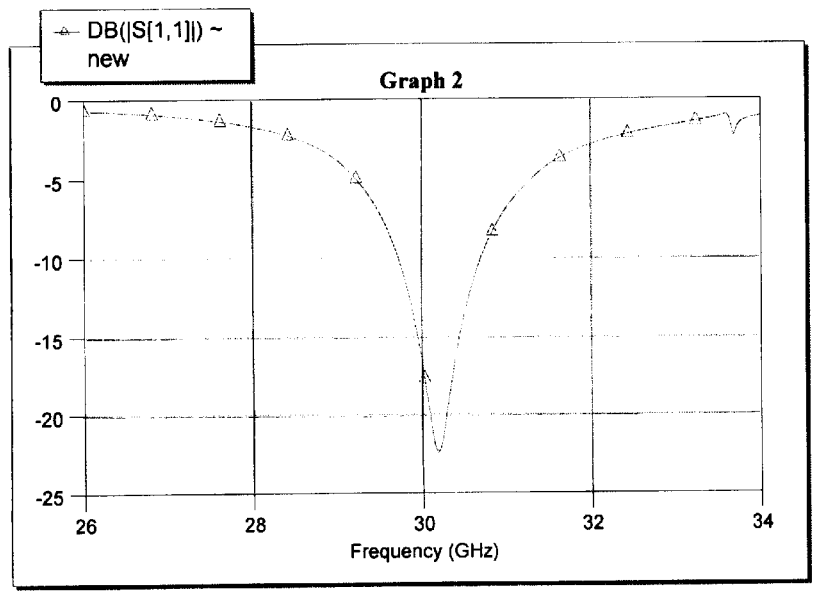
FIG. 5 shows the frequency response of a 30 GHz antenna.

When:

$\epsilon \gamma=1*0.4+4.82*0.1/0.5=1.764$ then,

L=0.49*10 mm/1.328=3.765 mm Dimensions of antenna: 4 mm*4 mm as shown in FIG. 4. Suggest referring to FIG. 5 for output response.

Figure 6:
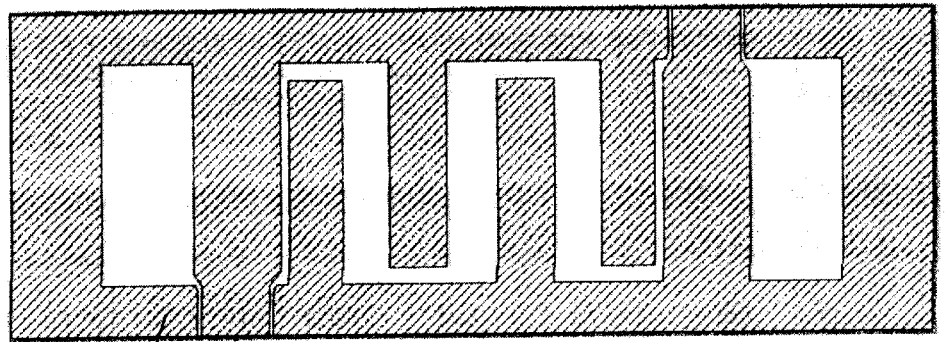
FIG. 6 shows a schematic layout of a 30 GHz filter.
Figure 7:
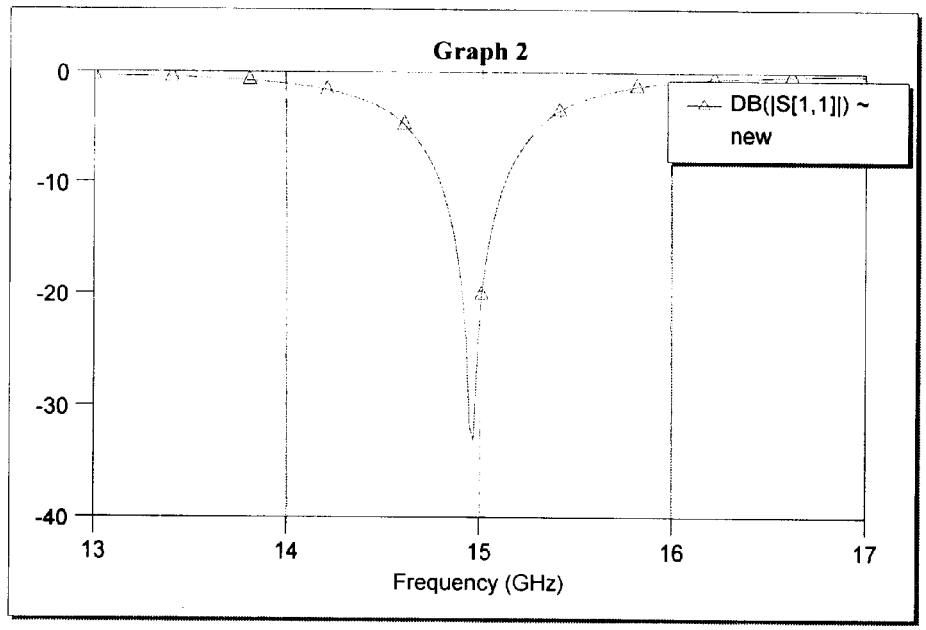
FIG. 7 shows the frequency response of the 30 GHz filter.

The filter design would rather base on the concept of a microshield line proposed by N. I. Dib than on the microstrip-line for the reason of: grounding without needing via hole or air-bridge; low loss and high Q; and advantages in design of high-frequency narrow band filters, particularly for monolithic integrated circuits at a frequency as high as 100 GHz though some more process steps are required. When an alumina substrate ($\epsilon \gamma$=9.5) is used, length of the filter is one fourth of the equivalent wavelength, namely, $L=0.25 \lambda_0/(\epsilon \gamma)^{1/2}$ =0.825 mm. In order to maintain the filter not too short, the substrate may be perforated from backside to lower the dielectric constant down to 2.0 so that the filter can be lengthened to 1.768 mm as shown in FIG. 6. For detailed reference of design parameters, see the literature: Chen-Tu Chi and G. M. Rebeiz, "Conductor-loss limited stripline resonator and filters," IEEE Trans. Microwave Theory Tech., vol. 44, No. 4, April 1996. See FIG. 7 for output/input response.

Embodiment 2

Frequency range applicable~medium (5 GHz~30 GHz)

λ(air)=60 mm~10 mm

After calculation, a "distributed" structure or a hybrid structure of coplanar waveguide (CPW) and microstrip lines formed in a double-layer framework is preferable for circuitry layout.

Example~15 GHz

Highlights

Type of antenna~one fourth wavelength microstrip-line patch antenna $L=\frac{1}{4} \lambda_d = \frac{1}{4} \lambda_0/(\epsilon \gamma)^{1/2}$, where $\lambda_0$ represents a free space wavelength, $\epsilon \gamma$ is an equivalent dielectric constant (containing 20% glass or PMMA and 80% air)

Figure 8:
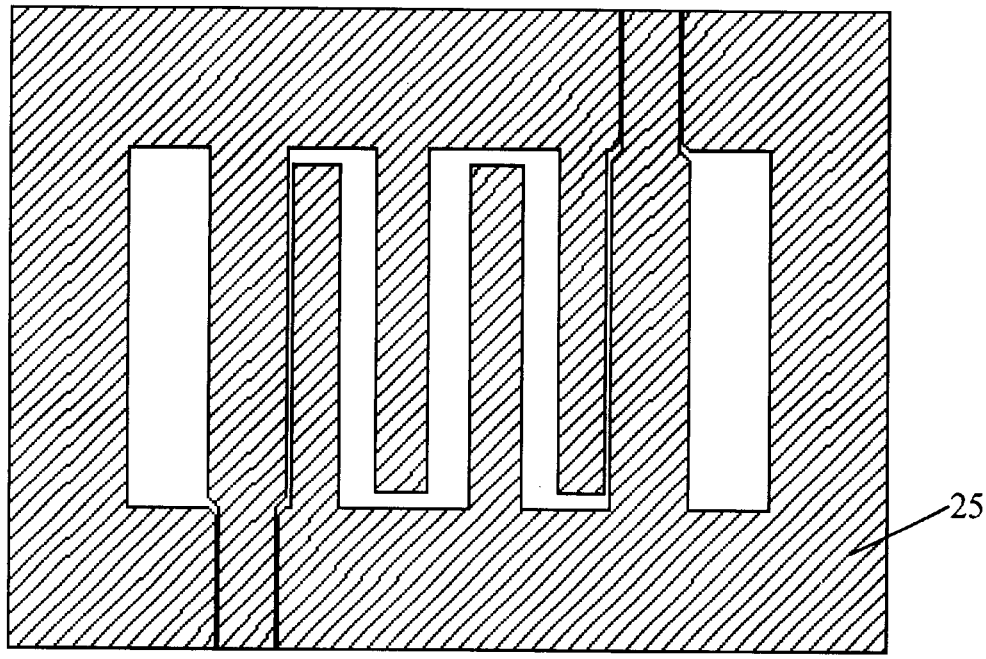
FIG. 8 is a top view of one-quarter-wavelength antenna of this invention.
Figure 9:
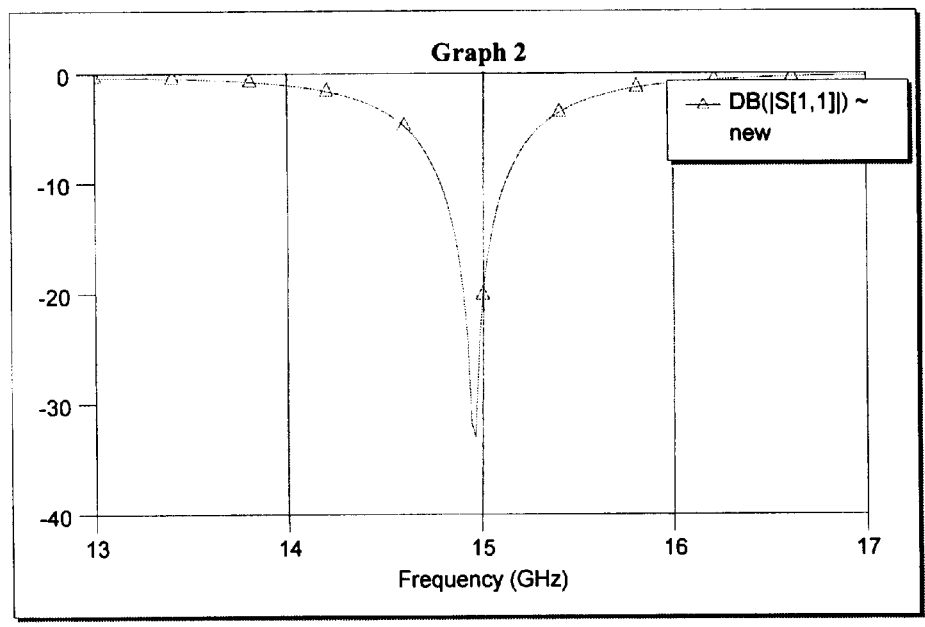
FIG. 9 shows the frequency response of a 15 GHz antenna.

When:

$\epsilon \gamma = 1 * 0.4 + 4.82 * 0.1/0.5 = 1.764$ then, $L = \frac{1}{4} * 20 \text{ mm}/1.328 = 3.765 \text{ mm}$ Dimensions of antenna: 4.25 mm*4 mm as shown in FIG. 8. For output response, see FIG. 9.

Figure 10:
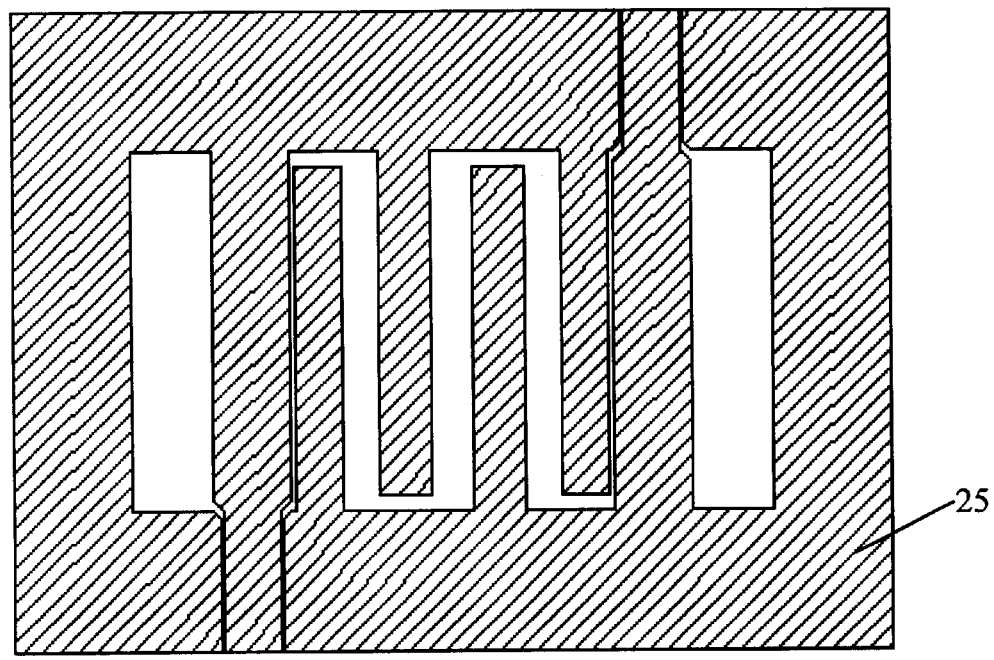
FIG. 10 is a schematic view of layout of a 15 GHz filter.
Figure 11:
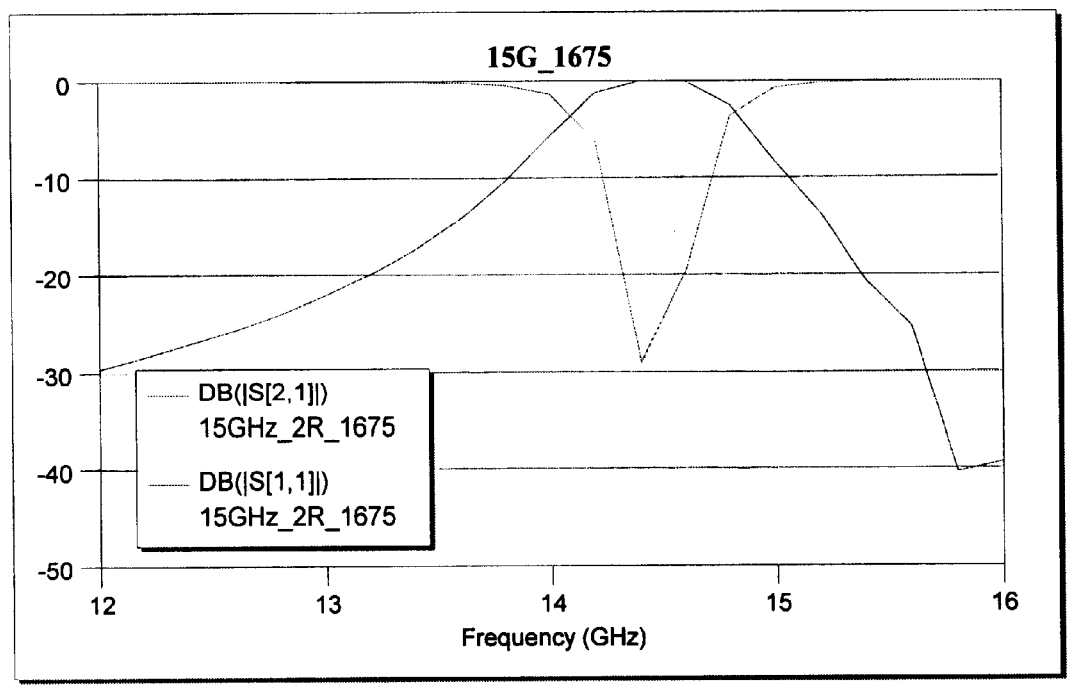
FIG. 11 shows the frequency response of the 15 GHz filter.

Design of the filter is about the same with the high-frequency filter. FIGS. 10 and 11 show the layout and frequency response of a 15 GHz filter.

Embodiment 3

Frequency range applicable~low (0.9 GHz~5 GHz)

λ(air)=330 mm~60 mm

λ g=110 mm~20 mm

After calculation, a "distributed" and "lumped" hybrid structure or a hybrid structure of coplanar waveguide (CPW) and microstrip lines formed in a triple-layer framework is preferable for circuitry layout.

This invention is now sticking to a 2.4 GHz passive component for low-frequency application to describe design highlights and related MEM fabrication process below.

Highlights

The concept of a radiator-structured 2.4 GHz antenna comes from a planar inverted F antenna (PIFA), which is folded in shape to shorten its length to facilitate mass production and lengthen the wavelength of the receivable waves and decrease the receivable frequency.

Figure 3:
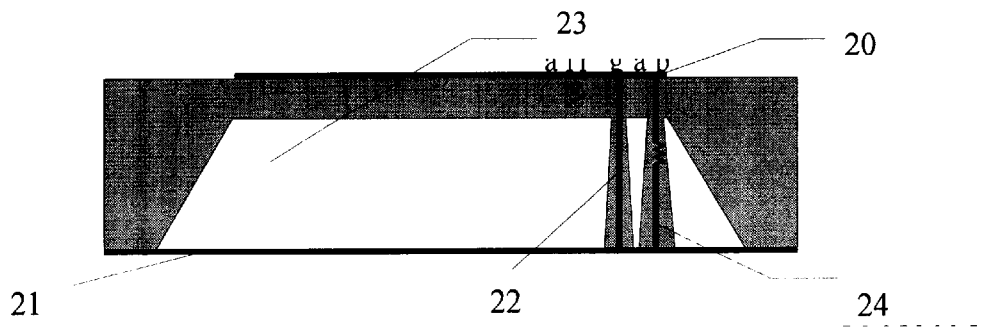
FIG. 3 shows an equivalent independent structure of antenna.
Figure 12:
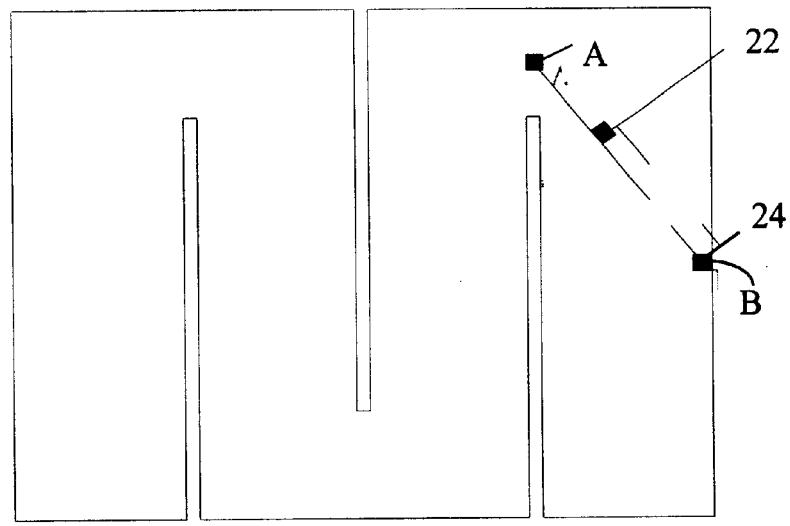
FIG. 12 shows the shape of a 2.4 GHz antenna (where point A is the midpoint above a groove; point B is the midpoint of the patch width; and d expresses the distance of a feeding position on the line segment AB from point B)
Figure 13:
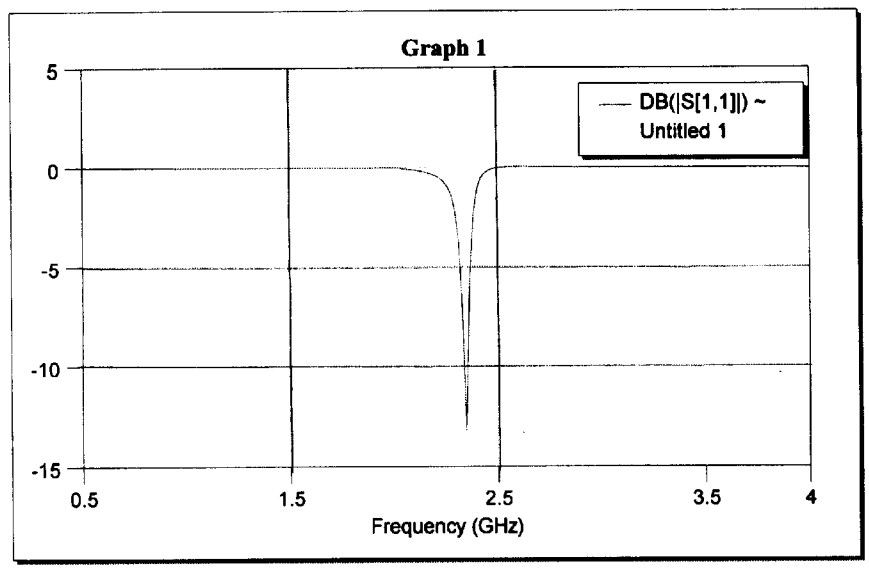
FIG. 13 shows the resonance frequency of the 2.4 GHz antenna.

The antenna of this invention is a modified PIFA antenna having its length cut to become shorter than one-eighth wavelength and its thickness, which may affect the bandwidth, thinner than one per cent of the wavelength to have the antenna itself shrinked significantly. According to the literature: King-Lu Wong and Kai-Ping Yang, "Modified planar inverted F antenna," Electronic Letters 8th January 1998, vol.34, No.1, the bandwidth of an antenna is widened by adding an extra resistor 24, and moreover, a distance change between points A and B shown in FIG. 12 may also affect the bandwidth. This antenna structure is the same with that shown in FIG. 3 except that the solid resistor is substituted with a thin film resistor, and the correspondent output response thereof is plotted in FIG. 13.

Figure 14:
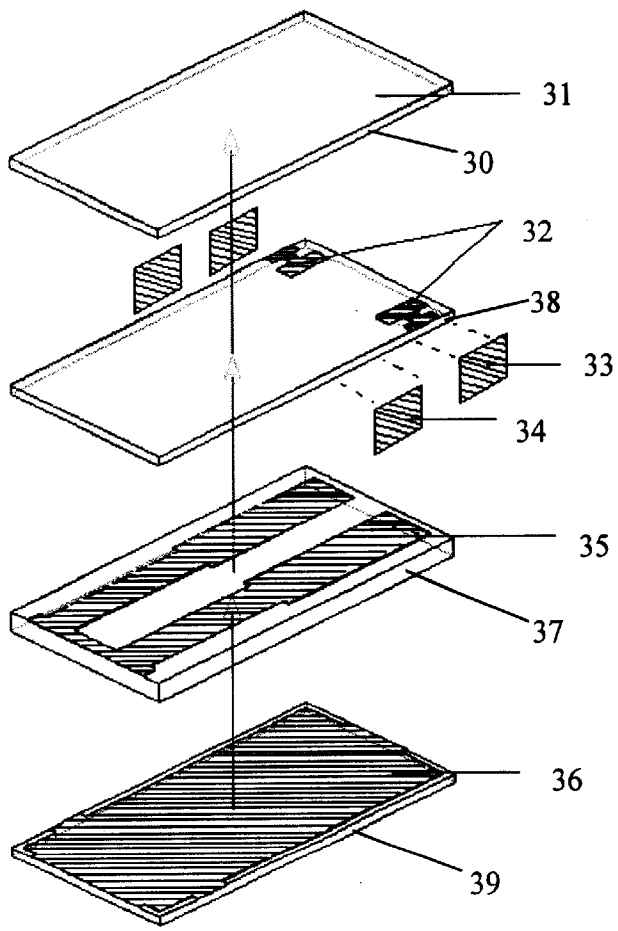
FIG. 14 shows a basic structure of a conventional 2.4 GHz filter.

In addition to the odd/even mode impedance concept for circuitry analysis, the hybrid circuit comprising "distributed" and "lumped" circuits and the microstrip-line structure are adopted in the low-frequency filter of this invention. The CPW structure designed for high-frequency operation (30 GHz or up) may not be suitable for low-frequency operation (0.9 GHz~5 GHz) when size-minimization is desired. As shown in FIG. 14, a conventional filter comprises a top shielding layer 31, a first dielectric substrate 30, a second dielectric substrate 38, a third dielectric substrate 37, a bottom shielding layer 36, a fourth dielectric substrate 39, a first metallic layer 32, and a second metallic layer 35. A "lumped" capacitor is formed by the first metallic layer 32, the second metallic layer 35, and the sandwiched second dielectric substrate 38 while the combination of the second metallic layer 35, the third dielectric layer 37, and the bottom shielding layer 36 serves for a "distributed capacitor." The via holes 33, 34 are arranged for connecting the top and the bottom shielding layer 31, 36 as well as other metallic layers to be grounded.

Figure 15:
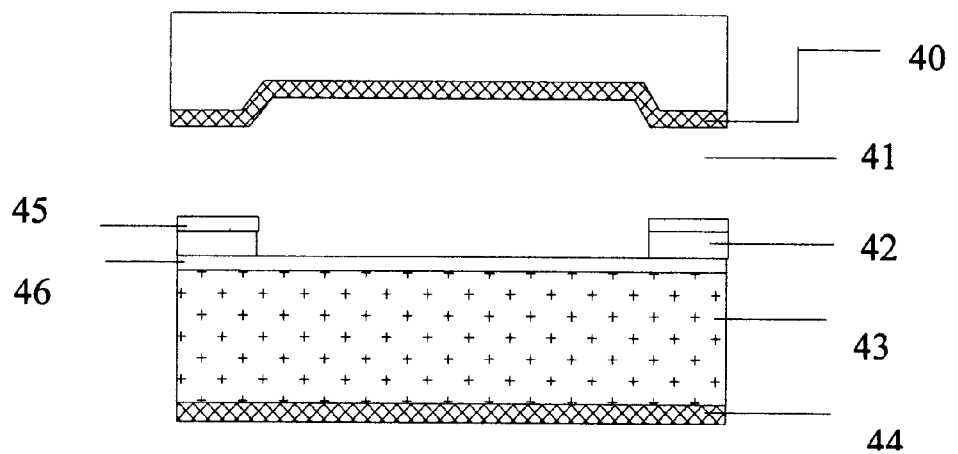
FIG. 15 is a cutaway sectional view of a 2.4 filter made by MEM fabrication process.

The geometrical shape of microstrip lines or striplines are dependent on four important parameters: h, w, t, and the dielectric constant of substrate, thus, part of or all the parameters may be amended for different designs of the filter. In this case, the size of filter is 4.32 mm*6.4 mm*1.0 mm. FIG. 15 is a cutaway sectional view of a 2.4 GHz filter made by MEM fabrication process. This filter comprises a top shielding layer 40, a first dielectric layer 41, a second dielectric layer 42, a third dielectric layer 43, a bottom shielding layer 44, a first metallic layer 45, and a second metallic layer 46, in a triple-layer dielectric structure. A "lumped" capacitor is formed by the first metallic layer 45, the second metallic layer 46, and the sandwiched second dielectric layer 42. The related data are listed below for easy reference:

| | Material | Thickness (mm) | Dielectric coefficient $\epsilon \gamma$ |
|---|---|---|---|
| First layer | Air | 0.1 | 1 |
| Second layer | $Ta_2O_5$ | 0.0002 | 25 |
| Third layer | Alumina | 0.5 | 9.5 |

Figure 16:
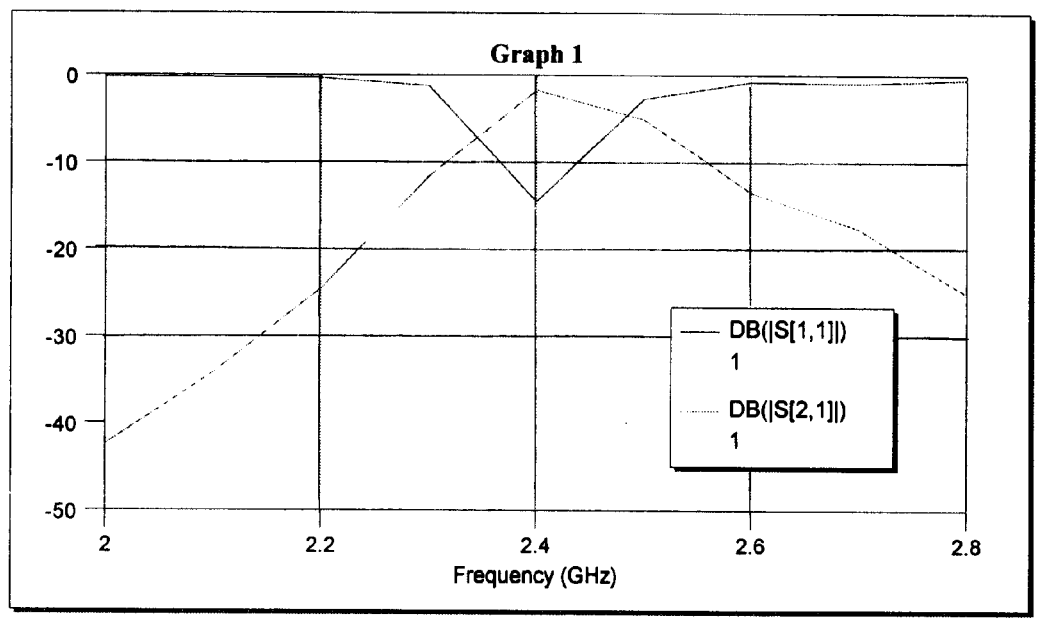
FIG. 16 shows the frequency response of the 2.4 GHz filter.

A fourth dielectric layer usually needed in the prior art is waived by using MEM fabrication process of this invention to have the production cost reduced and the volume of product shrunk. The frequency response of the 2.4 GHz filter made by MEM process is shown in FIG. 16.

MEM Process

Figure 17A:
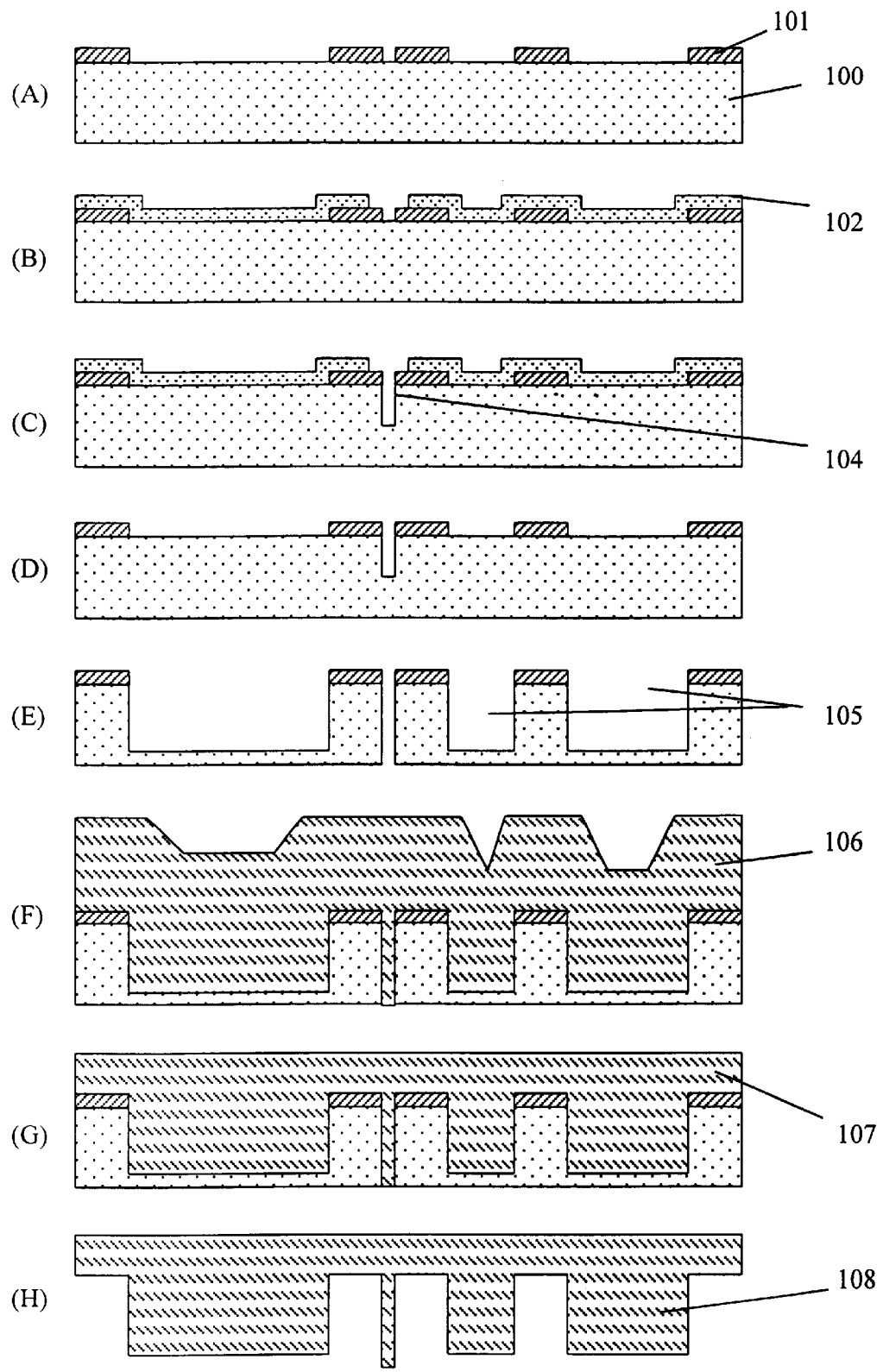
FIGS. 17A–B show MEM fabrication process of components on an upper substrate of this invention.
Figure 17B:
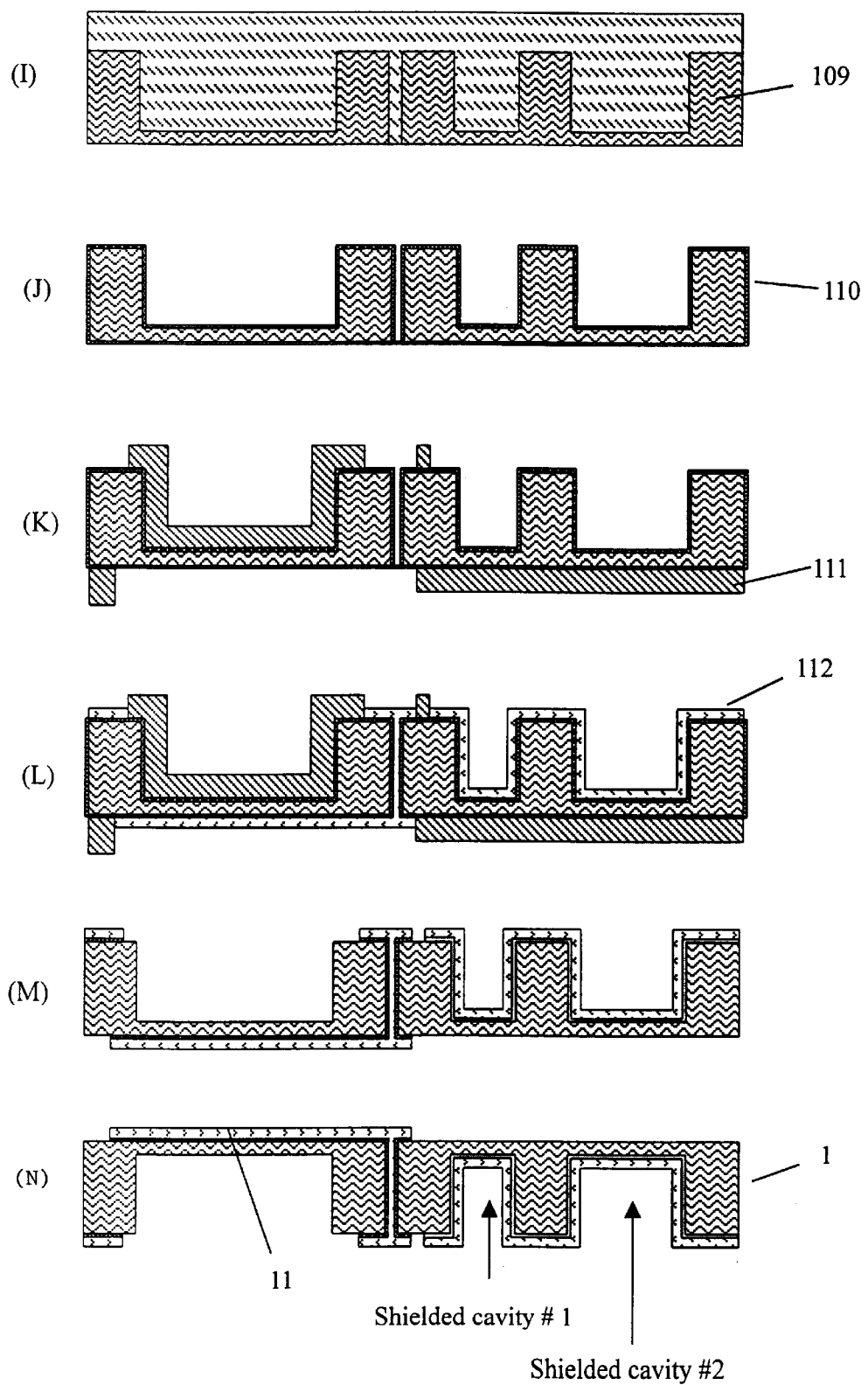
Figure 18A:
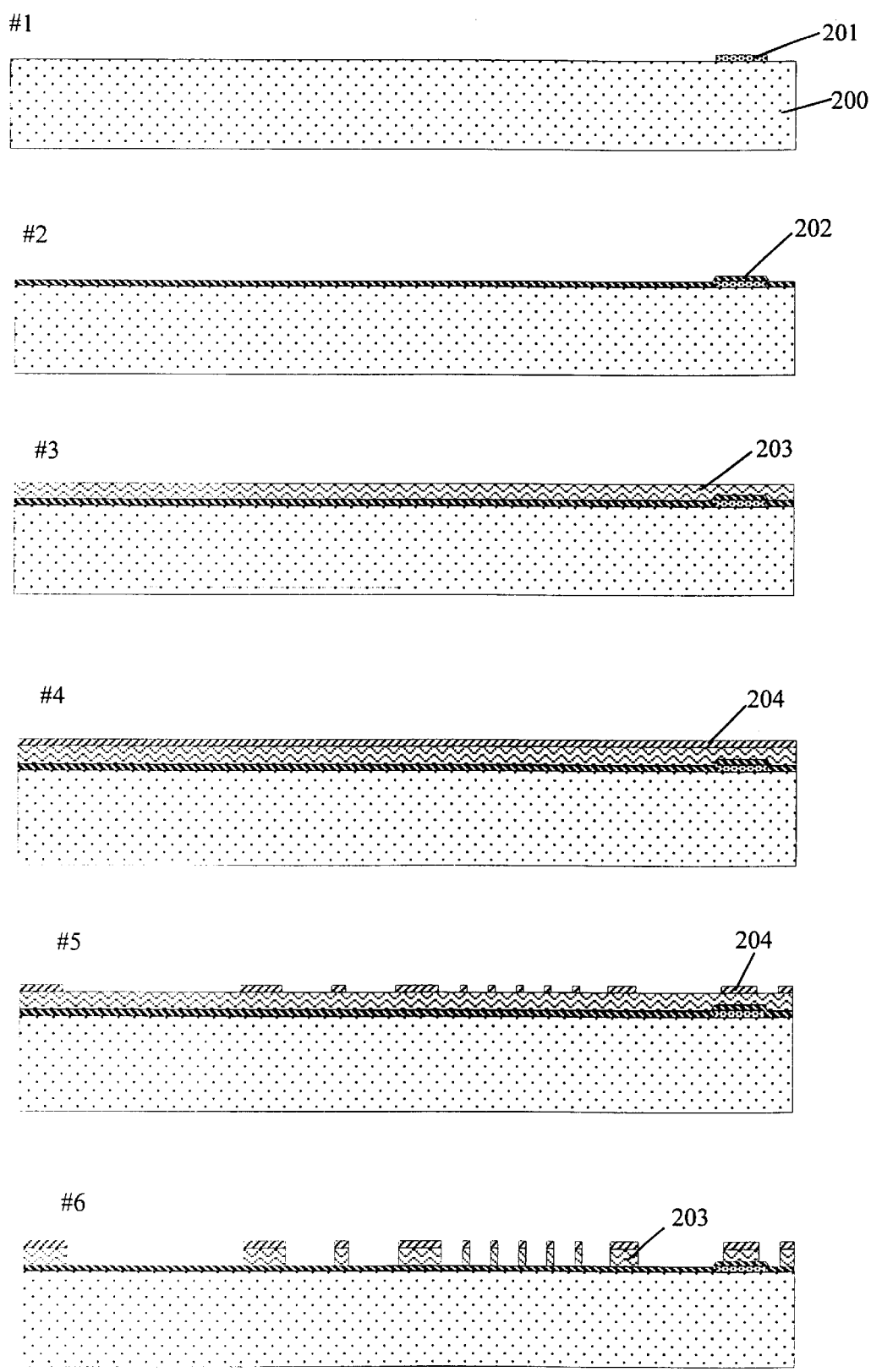
FIGS. 18A–E show MEM fabrication process of components on a lower substrate of this invention.
Figure 18B:
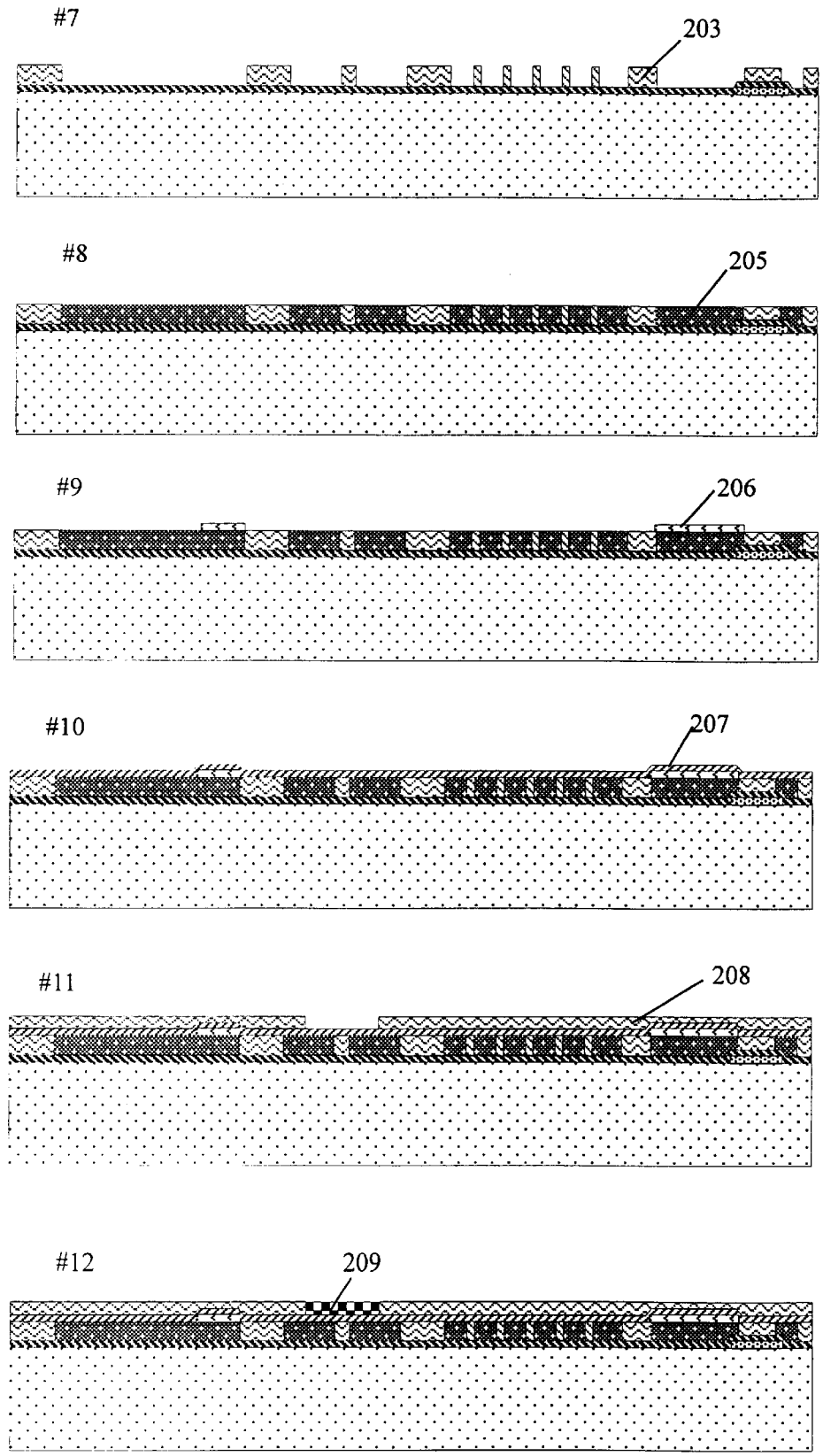
Figure 18C:
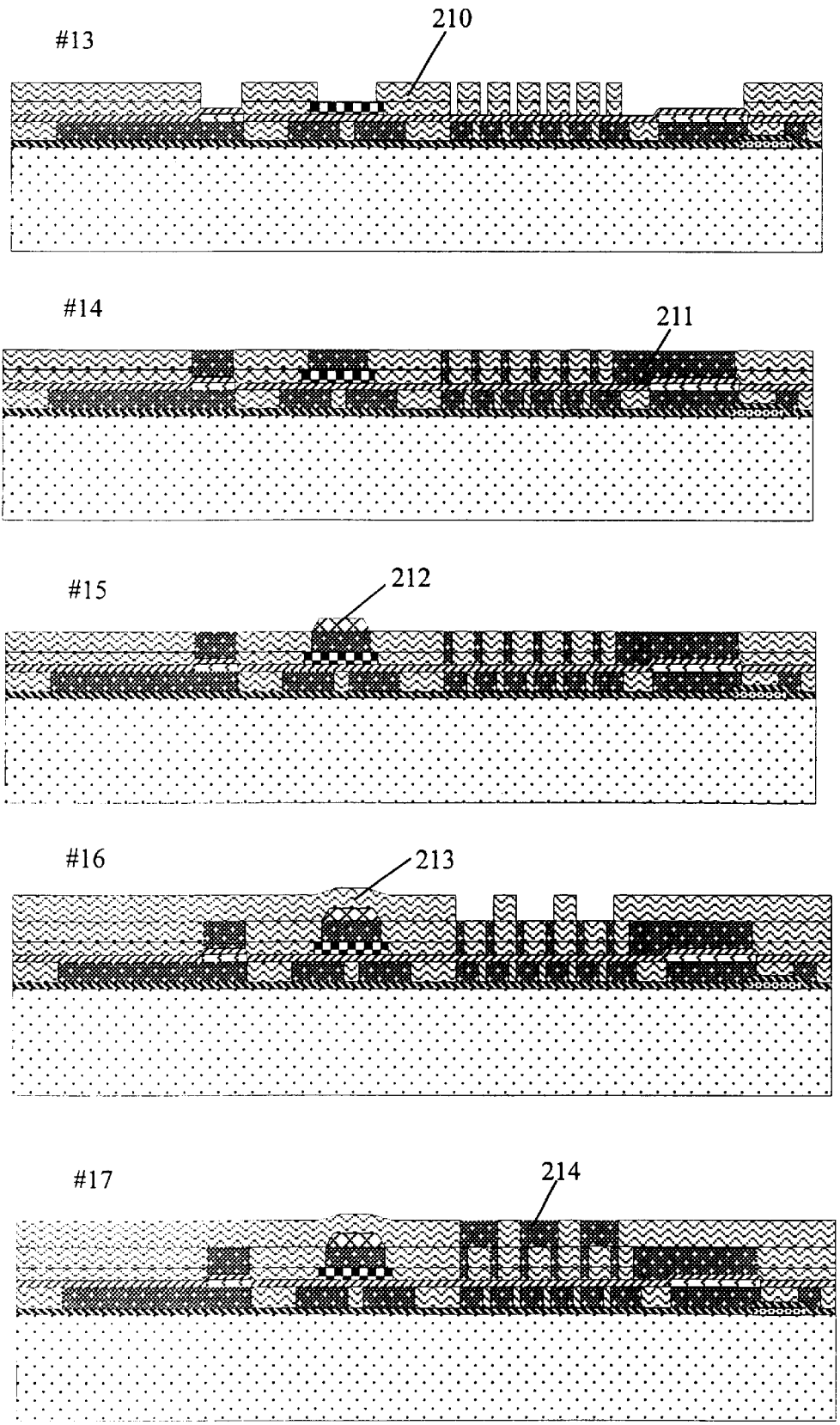
Figure 18D:
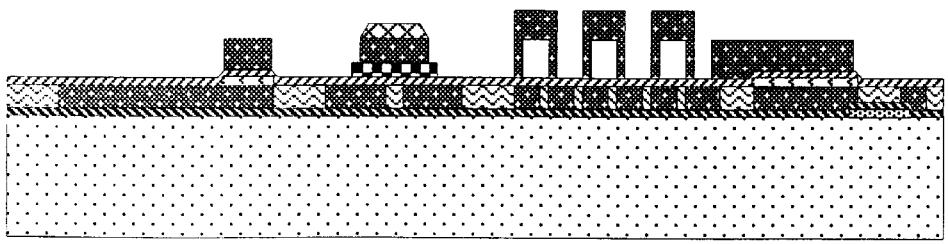
Figure 18D:
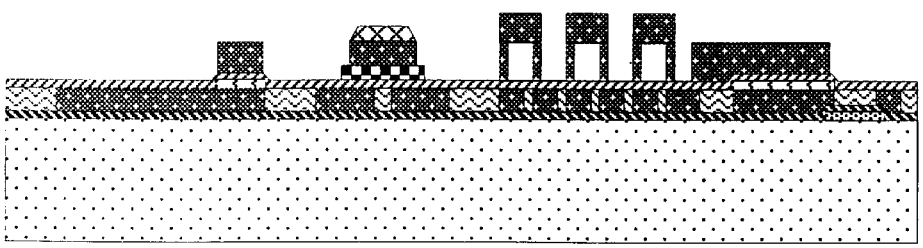
Figure 18D:
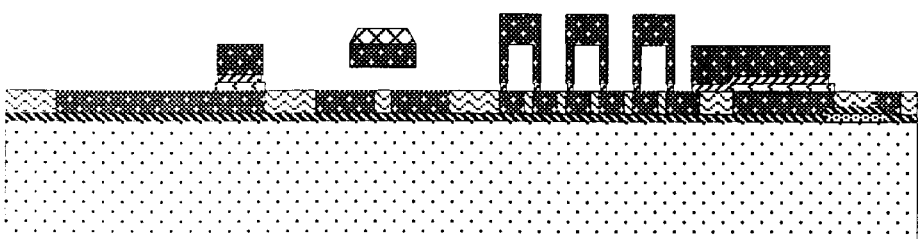
Figure 18D:
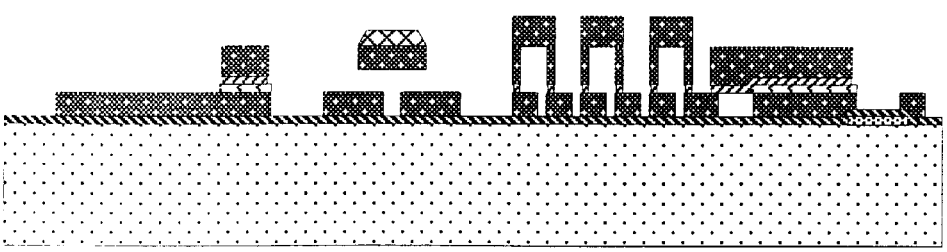
Figure 18D:
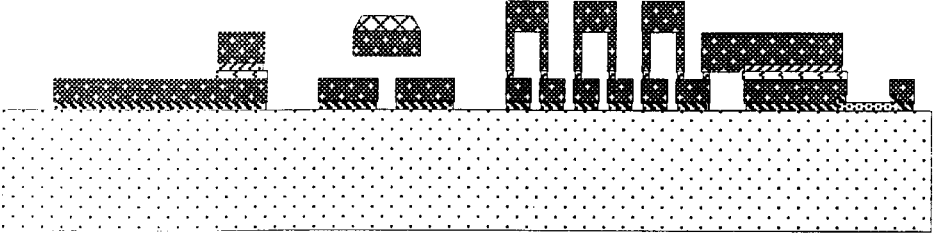
Figure 18E:
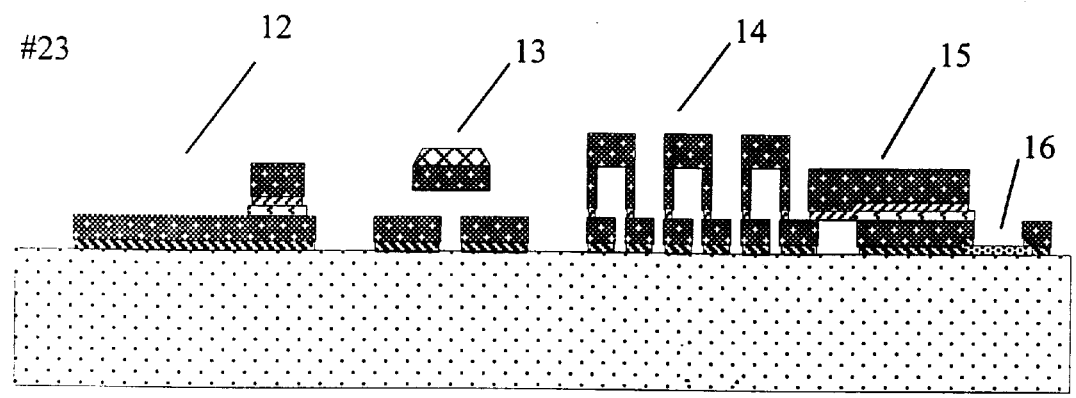

FIGS. 17 and 18 show the MEM techniques for fabricating integrated high-frequency communication passive components in low cost, high performance, and high reliability. In the process, low-cost copper in low resistivity is adopted for electroplating. The component is made in a double-layer structure comprising a top-layer substrate of polymer material or glass and a bottom-layer substrate of ceramic material. The related fabrication process is described below.

The Top-layer Substrate in PMMA (a Plastic Material)

Using a plastic material is based on the advantage of low cost and mass production because via holes or through holes are supposedly to be formed in the cover of a top-layer substrate by hot-embossing process, wherein the procedure is to firstly prepare some precise moldings through steps (A)~(H); hot-press PMMA with copper molds through step (I); and electroplate circuits through steps (J)~(N).

The steps (A)~(N) are briefly described as the following:

(A) Growing a silicon-oxide film 101 of 5000 Å thick on a silicon wafer 100 and etching it to define a silicon-oxide window;

(B) Spin coating with photoresist 102, then, masking and developing;

(C) Etching the silicon wafer with $SF_6/O_2$ plasma, the first time plasma etching, to form a via hole;

(D) Removing the photoresist with $O_2$ plasma;

(E) Etching the silicon wafer with $SF_6/O_2$ plasma, the second time plasma etching;

(F) Coating insulation lacquer on the bottom surface of a silicon substrate and electroless-plating a seeding layer on the front surface of the silicon substrate, and electroplating the substrate with nickel 106;

(G) Chemical mechanical polishing to planarize the nickel layer 107;

(H) Removing silicon base to obtain a nickel mold 108;

(I) Hot-embossing the PMMA layer 109;

(J) Electroless-plating a seeding layer 110 on the pressed PMMA layer 109;

(K) Coating an electrical deposition photoresist 111 to perform a standard lithography process;

(L) Electroplating copper 112;

(M) Removing the photoresist and flash-etching the seeding layer 110; and (N) Having a required cover 1 comprising a patch antenna 11, a via hole 104, and two seclusive cavities.

The Top-layer Substrate in Glass

Process #1~Plating the via holes in the substrate and depositing to emerge an antenna shape;

Process #2~In the case of etching depth limited in some-ten micrometers, using a Ti/Au mask to define an etching window, then etching the substrate with KOH etchant to form a backside cavity; or etching with a sand blaster to form a backside cavity of the substrate in the case of etching depth in some-ten micrometers up;

Process #3~Depositing a metallic layer on the bottom surface of the substrate, namely, the other end of the antenna, to work as a shield.

The Bottom-layer Substrate (Ceramics, for Example)

A plurality of passive components is disposed on an alumina substrate, then the thin film deposition and surface micromachining techniques are applied to complete this bottom-layer substrate as shown in FIG. 18.

Step #1~Sputtering to form a layer of metallic compound (TaNx) 201 on the substrate to serve as a thin-film resistor layer, patterning with lithography, then performing a wet- or dry-etching process;

Step #2~Sputtering or electroless-plating to form a seeding layer 202 on the substrate;

Step #3~Spin coating a polyimide layer 203, then curing for 1 hour at 350° C. by heat convection, or half an hour at 300° C. by microwave heating so as to prepare a molding plate for electroplating;

Step #4~Vapor-depositing to form an aluminum layer 204 to serve for an etching mask;

Step #5~Patterning with lithography and removing the undesired portion of the aluminum layer 204 by wet-etching;

Step #6~Performing reacting ion etching (RIE) $O_2$, or $O_2+CHF_3$ to remove the polyimide layer;

Step #7~Removing the upmost aluminum layer;

Step #8~Forming a copper layer 205 on the seeding layer by direct electroplating, then planarizing the copper layer by CMP to form a metallic bottom layer of inductance and a bottom electrode of capacitance and switches;

Step #9~Forming a layer of high dielectric constant 206 at a proper position by sputtering method or chemical vapor deposition (CVD) to serve for a dielectric layer of capacitance;

Step #10~Forming an top seeding layer 207 on the substrate by sputtering or electroless-plating approach;

Step #11~Forming a polyimide layer 208 as done in Steps #3~#7;

Step #12~Forming a metallic layer (Ni) 209 as a second metallic layer serving for a sacrifice layer;

Step #13~Forming a polyimide layer 210 as done in Steps 3~7;

Step #14~Depositing a copper layer 211 on the second layer to serve for a base of the inductors, meanwhile, a top electrode of capacitors and switches;

Step #15~Forming a ceramic layer (such as a silicon dioxide layer) 212 to serve for a mechanical structure of microswitch;

Step #16~Forming a polyimide layer 213 as done in Steps 3~7;

Step #17~Depositing a copper layer 214 to serve for a top metallic layer of inductance;

Step #18~Etching the polyimide layer by the isotropic plasma etching method;

Step #19~Removing nickel to have the structure released and a cantilever of the top electrode of switches suspended;

Step #20~Removing the second seeding layer by wet-etching process;

Step #21~Etching to remove the remaining polyimide layer by plasma etching method;

Step #22~Removing the first seeding layer by wet-etching process to have the bottom-layer substrate structured completely; and Step #23~Modifying the photo mask if desired for revising the filter 12, microswitch 13, inductor 14, capacitor 15, and resistor 16 on the bottom-layer substrate (cross-referring to FIG. 1) to fit different frequency bands.

Compatibility with CMOS Process

In view of abovesaid process summarily, it is understood that this invention is also applicable to serve for a post process of a CMOS process that has already laid an integrated on a silicon wafer. Temperature conditions of related process are listed in the table below:

| Step | Process | The highest temperature |
| --- | --- | --- |
| 1, 2, 4, 9, 10 | Sputtering, thermal vapor or electronic beam deposition | <450° C. |
| 3 | Polyimide curing | 250° C.~400° C.; lower temperature and shorter time are possible if heated by microwaves |
| 6 | RIE | Depends on operation time |
| 8 | CMP | <150° C. |
| 15 | PECVD | 300° C.~400° C. |
| 18 | plasma etching | Depends on operation time |

Merits

The merits of this invention may be summarized as the following when compared with the prior arts:

1. MEM techniques are fused into co-fired ceramics for fabrication of low-accuracy passive components at low cost.
2. MEM surface micromachining techniques are employed for fabricating capacitors, inductors, and microswitches on the substrate while MEM three-dimensional techniques and hot-embossing techniques are employed for forming an antenna and a shielding top cover on the substrate at another layer to thereby realize a multi-layer structure of antenna or low-frequency filter.
3. Design for isolation and process thereof are provided for integrating, minimizing the passive components, and for eliminating any possible coupling effect among the components.
4. The MEM process of this invention is compatible with the CMOS process in materials employed and temperature conditions and may serve for a post process for the latter.
5. Design of this invention is flexible in response to band requirements so that the circuitry area can be properly adjusted.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. A method for fabricating a multi-frequency passive communication integrated circuit comprising the steps of:
   (A) constructing a first set of electrical components on a first substrate by a micro-electromechanical process, said micro-electromechanical process including the steps of:
      (i) depositing at least one layer of material by sputtering, thermal vapor, or electron beam, wherein each layer is deposited at a temperature less than 450° C;
      (ii) curing at least one layer of a polyimide material, wherein each polyimide layer is cured at a temperature between 250° C. and 400° C.;
      (iii) applying at least one copper layer by direct electroplating;
      (iv) planarizing said at least one copper layer as deposited in step (iii) by chemical mechanical polishing, wherein each copper layer is planarized at a temperature of less than 150° C.; and
      (iv) applying at least one ceramic layer by plasma-enhanced chemical vapor deposition, wherein each ceramic layer is applied at a temperature of between 300° C and 400° C;
   (B) constructing a second set of electrical components on a second substrate;
   (C) forming in said second substrate at least one via hole and a plurality of cavities;
   (D) depositing a metal layer on an inner surface of each of said plurality of cavities;
   (E) adjoining said first substrate and said second substrate such that said first set of electrical components is positioned within said plurality of cavities; and
   (F) electrically coupling a circuit constructed from said second set of electrical components to a circuit constructed from said first set of electrical components through said at least one via hole.

2. The method for fabricating a multi-frequency passive communication integrated circuit as recited in claim 1, wherein said first substrate is a silicon substrate having CMOS circuitry formed thereon by a predetermined CMOS fabrication process whereby active components of said CMOS circuitry are buried in said silicon substrate during said CMOS fabrication process, and wherein selected ones of said first set of electrical components are fabricated on said silicon substrate by said micro-electromechanical process of step (A) after said CMOS fabrication process has been executed.

3. The method for fabricating a multi-frequency passive communication integrated circuit as recited in claim 2, wherein said micro-electromechanical process of step (A) includes the steps of:
   (1) successively repeating the following steps until a predetermined layered material structure has been completed:
      (a) depositing one or more material layers from the group of material layers consisting of a metallic layer, a metallic compound layer, a seeding layer, a dielectric layer and a ceramic layer;
      (b) processing said one or more material layers to form patterned structures thereon, each of said one or more material layers being processed according to one of a first set of predetermined patterns;
      (c) constructing a polyimide structure by performing the following steps:
         (i) applying a polyimide layer by spin coating an underlying material layer as deposited in step (1)(a) with a polyimide material;
         (ii) curing said polyimide layer;
         (iii) depositing an aluminum layer on said polyimide layer, said polyimide layer serving as an etching mask;
         (iv) lithography-patterning and wet-etching said aluminum layer according to one of a second set of predetermined patterns;
         (v) removing selected portions of said polyimide layer by reactive ion etching;
         (vi) removing remaining portions of said aluminum layer;
   (2) removing undesired material from said predetermined layered material structure to form said first set of electrical components by performing the following:
      (a) removing said polyimide structures successively constructed in step (1)(c) by inductively coupled plasma etching;
      (b) removing undesired material by etching from said one or more material layers successively deposited and processed in steps (1)(a) and (1)(b), respectively.

4. The method for fabricating a multi-frequency passive communication integrated circuit as recited in claim 3, wherein said processing of step (1)(b) is a selected from the group of processes consisting of lithography-patterning by wet- or dry-etching and chemical mechanical polishing.

5. The method for fabricating a multi-frequency passive communication integrated circuit as recited in claim 3, wherein said metallic layer or said metallic compound layer is formed from metal selected from the group consisting of tantalum nitride, nickel and copper.

6. The method for fabricating a multi-frequency passive communication integrated circuit as recited in claim 3, wherein said ceramic layer is formed from silicon dioxide.

7. The method for fabricating a multi-frequency passive communication integrated circuit as recited in claim 1, wherein said first substrate is constructed from low-temperature co-sintering ceramics.

8. The method for fabricating a multi-frequency passive communication integrated circuit as recited in claim 7, wherein selected ones of said first set of electrical components having low precision requirements or large area occupancy are buried in said low-temperature co-sintering ceramics and remaining ones of said first set of electrical components are fabricated on said low-temperature co-sintering ceramics by said micro-electromechanical process.

9. The method for fabricating a multi-frequency passive communication integrated circuit as recited in claim 1, wherein said second substrate is fabricated from low-cost plexiglass or polymeric material.

10. The method for fabricating a multi-frequency passive communication integrated circuit as recited in claim 9, wherein said first substrate is fabricated from ceramics, low-cost plexiglass, or high resistance silicon.

11. The method for fabricating a multi-frequency passive communication integrated circuit as recited in Claim 10, further comprising the steps of:

perforating a plurality of via holes in said first substrate to selected electrical components buried therein;

forming a plurality of bumps on a back surface of said first substrate; and coupling said plurality of bumps with an adjoining circuit and a soldering pad of a flip-chip package.

12. The method for fabricating a multi-frequency passive communication integrated circuit as recited in claim 11, wherein said adjoining circuit and said first substrate are housed in a low-temperature co-sintering ceramic compliant package.

13. The method for fabricating a multi-frequency passive communication integrated circuit as recited in claim 1, wherein said first and second sets of electrical components are passive electrical components.

14. The method for fabricating a multi-frequency passive communication integrated circuit as recited in claim 1, wherein said second set of electrical components includes an antenna.

* * * * *